(12) United States Patent
Heikkinen et al.

(10) Patent No.: US 11,406,021 B2
(45) Date of Patent: *Aug. 2, 2022

(54) SYSTEM FOR MANUFACTURING AN ELECTROMECHANICAL STRUCTURE

(71) Applicant: TactoTek Oy, Oulunsalo (FI)

(72) Inventors: Mikko Heikkinen, Oulu (FI); Jarmo Sääski, Kempele (FI); Jarkko Torvinen, Kempele (FI); Paavo Niskala, Oulu (FI); Mikko Sippari, Oulunsalo (FI); Pasi Raappana, Kempele (FI); Antti Keränen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 17/557,104

(22) Filed: Dec. 21, 2021

(65) Prior Publication Data

US 2022/0117091 A1 Apr. 14, 2022

Related U.S. Application Data

(60) Continuation of application No. 17/006,417, filed on Aug. 28, 2020, which is a continuation of application
(Continued)

(51) Int. Cl.
*H05K 3/00* (2006.01)
*B29C 45/14* (2006.01)
(Continued)

(52) U.S. Cl.
CPC ....... *H05K 3/0014* (2013.01); *B29C 45/1418* (2013.01); *B29C 45/14639* (2013.01);
(Continued)

(58) Field of Classification Search
CPC ........ H05K 3/0014; H05K 3/007; H05K 3/10; H05K 3/0011; H05K 1/0284;
(Continued)

(56) References Cited

U.S. PATENT DOCUMENTS 4,347,211 A 8/1982 Bandoh
4,584,767 A 4/1986 Gregory
(Continued)

FOREIGN PATENT DOCUMENTS

EP 0157261 A2 * 10/1985 ............. B29C 67/18
GB 2 284 699 A 6/1995
(Continued)

OTHER PUBLICATIONS

Office Action dated Oct. 27, 2020 issued in U.S. Appl. No. 16/140,633.
(Continued)

*Primary Examiner* — Jeffrey T Carley
(74) *Attorney, Agent, or Firm* — Robert P. Michal, Esq.; Carter, DeLuca & Farrell LLP

(57) ABSTRACT

A system for manufacturing an electromechanical structure includes first, second, and third entities. The first entity produces conductors on a planar, flat film. The second entity attaches electronic elements at locations on the film in relation to a three-dimensional shape of the film. The electronic elements include a number of surface mount technology components. The locations of the electronic elements are selected to omit substantial deformation during subsequent forming of the film into the three-dimensional shape. The third entity forms the film into the three-dimensional shape when the electronic elements are supported on the film. The third entity includes one or more machines that are continuously roll-fed, automatically in-precut-pieces-fed, computer numerical control, thermoforming, vacuum former, pressure forming, or blow molding. The first, sec-
(Continued)

ond, and third entities are arranged relative to one another to manufacture the electromechanical structure.

20 Claims, 5 Drawing Sheets

Related U.S. Application Data

No. 16/747,614, filed on Jan. 21, 2020, now Pat. No. 10,813,222, which is a continuation of application No. 16/168,927, filed on Oct. 24, 2018, now Pat. No. 10,986,735, application No. 17/557,104, which is a continuation of application No. 16/140,633, filed on Sep. 25, 2018, now Pat. No. 10,986,734, and a continuation of application No. 16/018,127, filed on Jun. 26, 2018, now Pat. No. 10,575,407, said application No. 16/168,927 is a division of application No. 16/018,127, filed on Jun. 26, 2018, now Pat. No. 10,575,407, application No. 17/557,104, which is a continuation of application No. 15/813,397, filed on Nov. 15, 2017, now Pat. No. 10,986,733, said application No. 16/140,633 is a continuation of application No. 15/030,883, filed on Apr. 21, 2016, now Pat. No. 10,660,211, said application No. 15/813,397 is a continuation of application No. 15/030,883, filed on Apr. 21, 2016, now Pat. No. 10,660,211, said application No. 16/018,127 is a division of application No. 15/030,883, filed on Apr. 21, 2016, now Pat. No. 10,660,211, application No. 17/557,104, which is a continuation of application No. 15/030,883, filed as application No. PCT/FI2014/050729 on Sep. 25, 2014, now Pat. No. 10,660,211.

(60) Provisional application No. 61/883,484, filed on Sep. 7, 2013.

(51) Int. Cl.
*H05K 1/02* (2006.01)
*H05K 1/03* (2006.01)
*B29L 31/34* (2006.01)

(52) U.S. Cl.
CPC ..... *B29C 45/14819* (2013.01); *H05K 1/0284* (2013.01); *H05K 1/0393* (2013.01); *B29C 45/14811* (2013.01); *B29C 2045/14237* (2013.01); *B29L 2031/3425* (2013.01); *B29L 2031/3481* (2013.01); *H05K 2201/0129* (2013.01); *H05K 2201/09118* (2013.01); *H05K 2203/1105* (2013.01)

(58) Field of Classification Search
CPC ............ H05K 1/0393; B29C 45/14819; B29C 45/1418; B29C 45/14639; B29L 2031/3425; B29L 2031/3481
See application file for complete search history.

(56) References Cited

U.S. PATENT DOCUMENTS

| | | | |
|---|---|---|---|
| 4,912,288 A | 3/1990 | Atkinson et al. | |
| 5,003,693 A | 4/1991 | Atkinson et al. | |
| 5,090,122 A | 2/1992 | Kitagawa | |
| 5,220,488 A | 6/1993 | Denes | |
| 5,264,061 A | 11/1993 | Juskey et al. | |
| 5,427,641 A | 6/1995 | Muramatsu et al. | |
| 6,404,643 B1 | 6/2002 | Chung | |
| 7,200,009 B2 | 4/2007 | Narhi et al. | |
| 7,728,710 B2 | 6/2010 | Mizuno et al. | |
| 8,198,979 B2 | 6/2012 | Haag et al. | |
| 8,294,055 B2 | 10/2012 | Kim et al. | |
| 8,552,299 B2 | 10/2013 | Rogers et al. | |
| 8,778,124 B2 | 7/2014 | Rendek, Jr. et al. | |
| 8,912,447 B2 | 12/2014 | Leong et al. | |
| 8,923,447 B2 | 12/2014 | Hu et al. | |
| 9,090,456 B2 | 7/2015 | Khonsari | |
| 9,753,488 B2 | 9/2017 | Hahn et al. | |
| 10,575,407 B2 | 2/2020 | Heikkinen et al. | |
| 10,660,211 B2 | 5/2020 | Heikkinen et al. | |
| 2005/0001767 A1 | 1/2005 | Wulff et al. | |
| 2005/0206047 A1 | 9/2005 | Lewison | |
| 2005/0227410 A1 | 10/2005 | Colella et al. | |
| 2006/0040094 A1 | 2/2006 | Mizuno et al. | |
| 2007/0031161 A1 | 2/2007 | Tandoli et al. | |
| 2007/0069418 A1 | 3/2007 | Liao et al. | |
| 2008/0006440 A1 | 1/2008 | Huonker | |
| 2008/0257706 A1 | 10/2008 | Haag | |
| 2009/0108985 A1 | 4/2009 | Haag et al. | |
| 2009/0185357 A1 | 7/2009 | Rendek, Jr. et al. | |
| 2011/0293924 A1* | 12/2011 | Liao .................... | B29C 45/1418 428/408 |
| 2012/0038593 A1 | 2/2012 | Ronka et al. | |
| 2013/0152386 A1 | 6/2013 | Pandojirao-S et al. | |
| 2013/0170171 A1 | 7/2013 | Wicker et al. | |
| 2013/0176746 A1 | 7/2013 | Nishimura et al. | |
| 2013/0234171 A1 | 9/2013 | Heikkinen et al. | |
| 2014/0160692 A1* | 6/2014 | Lau ........................ | B41M 3/006 361/736 |
| 2014/0177138 A1 | 6/2014 | Jolliffe et al. | |
| 2014/0182875 A1 | 7/2014 | Sprenger et al. | |
| 2015/0016144 A1 | 1/2015 | Keist et al. | |
| 2015/0092429 A1 | 4/2015 | Speer et al. | |
| 2015/0136837 A1 | 5/2015 | Maeda et al. | |
| 2015/0257278 A1 | 9/2015 | Niskala et al. | |
| 2015/0293558 A1 | 10/2015 | Hahn et al. | |
| 2016/0282977 A1 | 9/2016 | Moua et al. | |
| 2016/0309595 A1 | 10/2016 | Heikkinen et al. | |
| 2019/0029118 A1 | 1/2019 | Heikkinen et al. | |

FOREIGN PATENT DOCUMENTS

| | | |
|---|---|---|
| GB | 2500037 A | 9/2013 |
| JP | S61176139 A | 8/1986 |
| JP | S63284888 A | 11/1988 |
| JP | H1158680 A | 3/1999 |
| JP | 2007268713 A | 10/2007 |
| JP | 2012134272 A | 7/2012 |
| KR | 10-2013-0093168 A | 8/2013 |
| WO | 2010123733 A1 | 10/2010 |
| WO | 2011045474 A1 | 4/2011 |
| WO | 2012049898 A1 | 4/2012 |
| WO | 2013058708 A1 | 4/2013 |

OTHER PUBLICATIONS

Japanese Office Action issued by the Japanese Patent Office in relation to Japanese Application No. 2019-232630 dated May 25, 2021 (3 pages) along with English language translation (3 pages).
Extended European Search Report issued by the European Patent Office in relation to European Patent Application No. EP 14 84 9632 dated May 17, 2017 (8 pages).
Office Action issued in U.S. Appl. No. 15/813,397 dated Mar. 5, 2018 (19 pages).
Office Action issued in U.S. Appl. No. 15/813,397 dated Jul. 26, 2018 (13 pages).
Office Action issued by the Japanese Patent Office in relation to Japanese Application No. 2016-544776 dated Oct. 9, 2018 (3 pages) along with English language translation (3 pages).
Communication pursuant to Article 94(3) EPC issued by the European Patent Office in relation to European Patent Application No. EP 14 849 632 dated Apr. 10, 2019 (5 pages).
Office Action issued by the Korean Intellectual Property Office in relation to Korean Application No. 10-2016-7011262 dated Jan. 6, 2020 (8 pages) along with English language translation (5 pages).
Office Action issued in U.S. Appl. No. 15/813,397 dated Nov. 22, 2020 (16 pages).

(56) References Cited

OTHER PUBLICATIONS

Office Action issued in U.S. Appl. No. 15/030,883 dated Jun. 25, 2018 (16 pages).
Office Action issued in U.S. Appl. No. 15/030,883 dated Apr. 4, 2019 (26 pages).
Office Action issued in U.S. Appl. No. 16/168,927 dated May 11, 2020 (13 pages).
Office Action dated Jun. 24, 2020 issued in U.S. Appl. No. 16/140,633.
Office Action dated Aug. 4, 2020 issued in U.S. Appl. No. 16/168,927.
Office Action dated Jun. 24, 2020 issued in U.S. Appl. No. 16/747,614.
Office Action issued in U.S. Appl. No. 17/006,417 dated Dec. 4, 2020.
Office Action issued in U.S. Appl. No. 15/813,397 dated Mar. 5, 2018 (31 pages).
Office Action issued in U.S. Appl. No. 15/813,397 dated May 8, 2020 (14 pages).
Office Action issued in U.S. Appl. No. 15/813,397 dated Nov. 22, 2019 (15 pages).
Office Action issued in U.S. Appl. No. 15/813,397 dated Apr. 4, 2019 (14 pages).
Office Action issued in U.S. Appl. No. 16/018,127 dated Oct. 24, 2019 (6 pages).
Office Action issued in U.S. Appl. No. 16/018,127 dated May 31, 2019 (8 pages).
Office Action issued in U.S. Appl. No. 16/018,127 dated Feb. 20, 2019 (9 pages).
Office Action issued in U.S. Appl. No. 16/018,127 dated Aug. 28, 2018 (14 pages).
Office Action issued in U.S. Appl. No. 15/030,883 dated Nov. 20, 2019 (12 pages).
Office Action issued in U.S. Appl. No. 15/030,883 dated Apr. 4, 2019 (10 pages).
Office Action issued in U.S. Appl. No. 15/030,883 dated Sep. 11, 2018 (12 pages).
Office Action issued in U.S. Appl. No. 16/168,927 dated Aug. 4, 2020 (6 pages).
Office Action issued in U.S. Appl. No. 15/813,397 dated Aug. 17, 2020 (19 pages).
Office Action issued in U.S. Appl. No. 16/140,633 dated Jun. 24, 2020 (14 pages).
Office Action dated May 8, 2020 issued in U.S. Appl. No. 15/813,397.
Office Action dated Aug. 17, 2020 issued in U.S. Appl. No. 15/813,397.
Office Action issued in U.S. Appl. No. 16/140,633 dated Oct. 27, 2020.
Extended European Search Report issued by the European Patent Office in relation to European Application No. 21203098.5 dated Nov. 30, 2021 (7 pages).

* cited by examiner

SYSTEM FOR MANUFACTURING AN ELECTROMECHANICAL STRUCTURE

CROSS REFERENCE TO RELATED APPLICATIONS

This application is a continuation of U.S. patent application Ser. No. 17/006,417 filed Aug. 28, 2020, which is a continuation of U.S. patent application Ser. No. 16/747,614 filed Jan. 21, 2020 (now U.S. Pat. No. 10,813,222), which is a continuation of U.S. patent application Ser. No. 16/168,927 filed Oct. 24, 2018 (now U.S. Pat. No. 10,986,735), which is a continuation of U.S. patent application Ser. No. 16/018,127 filed Jun. 26, 2018 (now U.S. Pat. No. 10,575,407), which is a divisional of U.S. patent application Ser. No. 15/030,883 filed Apr. 21, 2016 (now U.S. Pat. No. 10,660,211); and the present application is a continuation of U.S. patent application Ser. No. 15/813,397 filed Nov. 15, 2017 (now U.S. Pat. No. 10,986,733), which is a continuation of U.S. patent application Ser. No. 15/030,883 filed Apr. 21, 2016 (now U.S. Pat. No. 10,660,211), which is a national stage entry application of PCT Patent Application Serial No. PCT/FI2014/05072, filed Sep. 25, 2014, which claims the benefit of U.S. Provisional Patent Application Ser. No. 61/883,484 filed Sep. 27, 2013, the entire disclosure of each of which is incorporated herein by reference.

FIELD OF THE INVENTION

Generally the present invention concerns electromechanical structures incorporated in electronic devices. Particularly, however not exclusively, the invention pertains to a method of creating three-dimensional single substrate electromechanical structures with embedded components and elements.

BACKGROUND INFORMATION

Manufacturing methods of different electromechanical devices have improved tremendously specifically as mobile devices and such with features, such as sophisticated displays and interactive/responsive covers, have become more commonly used consumer appliances. Such devices incorporate sophisticated touchscreens, touch surfaces and the like with numerous functionalities, which in turn, requires using different, and often delicate, components.

The ever increasing user needs for large variety of functionalities and intuitiveness of products have helped to create a situation where a user doesn't want the device to limit their use. Instead, all the devices should be more enabling than restricting to use in a way that is instantly intuitive.

At the same time, the need for more agile and flexible manufacturing has become increasingly evident since the outer design of devices as well as the components used inside have needed to develop and change along with dynamic market needs.

This creates a real need for a manufacturing process that enables incorporating various different components in relation to the housing structure, be it two- or three-dimensional.

Although components have become increasingly smaller and more flexible many of them are still relatively bulky compared to printed electronics. Printed electronics have shown the way to thin, flexible and rapidly manufactured structures but a vast amount of components cannot still be manufactured by printing.

Also, creating three-dimensional substrates and housing structures with embedded electronic components is presently done by first shaping the substrate and then attaching the components to the ready-shaped three-dimensional substrate. Attaching components on such three-dimensional substrates creates a disadvantageous situation where components are attached on inclined surfaces, which creates inaccuracies and is also otherwise difficult and time-consuming from the manufacturing perspective especially when compared to the process where components are attached on a flat surface.

Some other methods propose placing components on a substrate (onto preferred locations) and then molding over the substrate, which then functions as an insert; method which is in most cases carried out by injection molding. This method is prone to many mistakes and failures because the components need to be placed highly accurately in correct places and then kept there throughout the molding process. Another difficulty of this process is the somewhat violent temperature changes caused by the molten material as it cools down. Together these requirements lead to a very difficult situation, wherein a lot of faulty units do occur. Even further, this method doesn't provide the means for a truly three-dimensional shaping as the substrate, which is used as an insert, doesn't considerably change its shape during the process. Moreover, each mold can be only done once; after the substrate and the components therein have been overmolded the shape and the circuit-component structure is set so it isn't possible to fix flaws.

Some other manufacturing processes comprise using laminated surfaces that consist of a number of layers or substrates piled and attached on each other. These methods however also embody disadvantages, such as the limited malleability from flat to three-dimensional.

SUMMARY

An objective of the embodiments of the present invention is to at least alleviate one or more of the aforesaid drawbacks evident in the prior art arrangements particularly in the context of manufacturing methods and arrangements that allow for efficient integration of various electronic elements on a flat surface before shaping and coating or encapsulating it. The objective is generally achieved with a method of manufacture and corresponding arrangement for carrying out said method in accordance with the present invention.

One of the advantageous aspects of the present invention is that it allows the electronic elements to be placed on a substantially flat surface and then shape the surface housing the electronic elements from flat to substantially, in practical circumstances, any desired three-dimensional shape. Even further, the invention comprises a method and system for placing and attaching elements on a three-dimensionally formable film in relation to the shape and design that the film is to be molded.

Another advantageous aspect of the present invention is that it minimizes the need for layered film and coating film and sheet structures, which are often the result of laminating layers, by using only one film to house electronics, graphical and other used content.

Another advantageous aspect of the invention is that the electronic circuits and the elements may be attached on a flat surface, then tested that the circuit and the elements work, before forming the substrate into substantially three-dimensional according to any preferred shape.

In accordance with one aspect of the present invention a method for manufacturing an electromechanical structure, comprising:

producing conductors and/or graphics on a substantially flat film, attaching electronic and/or functional elements, e.g. MEMS, on said film in relation to the desired three-dimensional shape of the film, forming the said film housing the electronic elements into a substantially three-dimensional shape, using the substantially three-dimensional film as an insert in an injection molding process by molding substantially on said film, wherein a preferred layer of material is attached on the surface of the film, creating a electromechanical structure.

According to an exemplary embodiment of the invention the substantially flat film may be substantially flexible. According to an exemplary embodiment of the invention the film comprises a substrate. According to an exemplary embodiment the film comprises a printed circuit board (PCB) or printed wiring board (PWB).

According to an exemplary embodiment of the invention the substantially flat film is preferably uniform and non-laminated, i.e. non-laminated sheet. According to an exemplary embodiment of the invention the substantially flat film may comprise a laminated structure. According to an exemplary embodiment of the invention the substantially flat film may comprise coating.

According to an exemplary embodiment of the invention, producing conductors on said film preferably comprises printing. According to another exemplary embodiment of the invention, producing conductors on said film may comprise wiring. According to another exemplary embodiment of the invention, producing conductors on said film may comprise soldering. According to another exemplary embodiment of the invention, producing conductors on said film may comprise using a printed circuit board (PCB) or a printed wiring board (PWB).

According to an exemplary embodiment of the invention producing graphics on said film may preferably comprise printing. According to an exemplary embodiment of the invention producing graphics on said film may comprise painting.

According to an exemplary embodiment of the invention the electronic elements used may be electronic, electro-optic, electroacoustic, piezoelectric, electric, and/or electro-mechanical in nature. According to another exemplary embodiment of the invention the electronic elements may comprise surface-mount technology (SMT), through-hole or flip-chip entities. According to another exemplary embodiment of the invention said electronic elements may comprise substantially flexible components. According to a further exemplary embodiment of the invention the electronic elements may be printed entities. According to another exemplary embodiment of the invention, wherein the electronic elements may be printed entities, said elements may be printed on the substantially flat film According to further exemplary embodiment of the invention, wherein the electronic elements may be printed entities, said elements may be printed elsewhere (e.g. on a separate substrate that may be cut into suitable pieces after or before the printing), after which they may be attached ready-printed on the substantially flat film.

According to an exemplary embodiment of the invention the electronic elements may be attached to the film e g by optionally substantially flexible and/or conductive glue, paste or other adhesive. According to another exemplary embodiment of the invention the elements may be attached by anchoring.

According to an exemplary embodiment of the invention attaching of the electronic elements is done relative to the desired shape of the film During the process of forming of the film from a substantially flat in to three-dimensional, the film and the elements incorporated thereon undergo physical stress, such as strain, torque and compression. These forces are caused by not only the bending and stretching of the film but from the temperature needed for the process as well. The process of attaching elements may, according to the present invention, comprise many, individual or coincident, sequences.

According to an exemplary embodiment of the invention an optional sequence of attaching the electronic elements may comprise, by for example computer-aided modeling (CAD), model building or three-dimensional surface strain measurement carried out for example by uniform square grid pattern or circular grid pattern or any other suitable shaped pattern, for modeling the shape of the three-dimensional design of the three-dimensional film Modeling may comprise the parameters of strains, forces, dimensions, thermal and stress analyses as well as possible failures, such as fractures of the film caused by the forming of the substantially flat film into substantially three-dimensional. Modeling may comprise stress analysis of the structure. Modeling may comprise also manufacturing analysis for process simulation of manufacturing processes, such as casting, molding and other forming manufacturing methods.

Another optional sequence of an exemplary embodiment of the invention may comprise choosing the orientation of the elements in relation to the surface shapes of the three-dimensional film design. In general this means placing an element according to the shape of the surface, on which it is to be attached on, so that the deformation of the flat surface area of the film relative to the surface area of the element against the said surface area of the film is as little as possible. More specifically, the magnitude of the curvature of the film surface, said curvature caused by the three-dimensional forming of the film, relative to the facing element surface projection should be minimized. Setting the orientation of an element according to the hypothetical curvature on the three-dimensional surface, as the curvature and/or the strain caused by the deformation is not yet apparent in the element attaching sequence, so that the said curvature between and/or relative to the elements far edges or physical boundaries, on which it has attaching/bounding contact to the film surface, and which is caused by the three-dimensional forming of the film, causes as little separation and/or distance between the film surface and element bottom surface relative to the curved film surface.

Another optional sequence of an exemplary embodiment of the invention may comprise choosing the electronic element location in relation to the surface shapes of the three-dimensional film design. In general this means placing an element according to the shape of the surface, on which it is to be attached on, so that the deformation of the flat surface area of the film relative to the surface area of the film of the element against the said surface area of the film deforms as little as possible. More specifically, the magnitude of the curvature and/or the strain of the film surface relative to the facing/bottom element surface projection, said curvature caused by the three-dimensional forming of the film, should be minimized. By choosing the location of an element so it is placed on a surface that deforms as little as possible, as the curvature caused by the deformation is not apparent in the element attaching sequence, the element will go through less physical strains. Choosing the element location in relation to the film surface comprises also choosing locations wherein the element bottom relative to the film surface and the relative film surface touching surface is optimized, by for example maximizing the touching surface areas. Choosing a good location for an element accordingly to the film surface so means that an element shouldn't be placed on the far edges of the film surface, wherein the element is partially over the ultimate edge of the surface of the film.

According to an exemplary aspect of the invention, some of the aspects caused by the three-dimensional forming of the film on the elements attached thereon may be alleviated by the optional use of substantially flexible elements.

According to another exemplary aspect of the invention, some of the aspects caused by the three-dimensional forming of the film on the elements attached thereon may be alleviated by the use of substantially flexible attaching means of the elements.

Another optional sequence of an exemplary embodiment of the invention is choosing the elements in relation to the manufacturing parameters and in terms of the physical properties, such as physical strength and tolerance to temperature and temperature changes as well as suitability with different materials of the elements.

Another optional sequence of an exemplary embodiment of the invention comprises choosing the attaching method in accordance with flexibility, strength and so forth.

Another optional sequence of an exemplary embodiment of the invention comprises choosing the side on which the forming is done as well as the injection molding and the injection molding type. Preferably the elements are attached on the side of film opposite to the side which is for example pressed against a forming wall or molded on or over. The elements may be however attached on the side which is molded on or over.

According to an exemplary embodiment of the present invention the film and the elements thereon may be formed into a substantially three-dimensional shape preferably by thermoforming or vacuum forming According to another exemplary embodiment of the invention the film and the elements thereon may be formed into a substantially three-dimensional shape by blow molding or rotational molding.

Herein the three-dimensional essence of the formed structure may be understood in relation to the flat film's essential thickness among other options. Three-dimensional form may be herein described as/through deviation, which is described hereinafter. The substantially flat film can be seen as to fit between two parallel planar (flat) surfaces, which take account even the slightest deformation on an even seemingly flat surface.

After the three-dimensional forming process the shape, in which the previously flat film has been formed in, can be also seen as to fit between two parallel surfaces. The distance, measured by the length of the line that extends maximally in between the two surfaces and in parallel with the normal of either surface against the other, yields the minimum distance that the surfaces can be situated from each other without overlapping with film, both as substantially flat and as three-dimensional. Said minimum distance between the two parallel surfaces in both cases may be compared as to count the deviation percentage. The deviation referred herein is so the ratio of the shortest distance between the two parallel surfaces that don't overlap with the three-dimensionally formed film to the shortest distance of the same film before the three-dimensional forming Preferably, the deviation is at least:

|           | 1.      | 2.      | 3.      | 4.       |
|-----------|---------|---------|---------|----------|
| Deviation | 1.001   | 1.01    | 1.1     | 1        |
|           | 5.      | 6.      | 7.      | 8.       |
| Deviation | 2       | 5       | 10      | 20       |
|           | 9.      | 10.     | 11.     | 12.      |
| Deviation | 40      | 50      | 80      | 100      |
|           | 13.     | 14.     | 15.     | 16.      |
| Deviation | 200     | 500     | 1000    | 5000     |
|           | 17.     | 18.     | 19.     | 20.      |
| Deviation | 10000   | 50000   | 100000  | 500000   |
|           | 21.     | 22.     | 23.     | 24.      |
| Deviation | 1000000 | 2000000 | 5000000 | 10000000 |

According to an exemplary embodiment of the present invention the injection molding material is molded substantially exclusively partially over the film surfaces. Optionally injection molded material may be molded on a surface portion of the film housing the electronic elements. Optionally the injection molded material may be molded on a surface portion of the film not housing electronic elements.

According to another exemplary embodiment of the present invention the injection molded material, molded substantially on the said film, encapsulates the whole film.

According to another exemplary embodiment of the present invention the injection molding may encapsulate the whole film but not the electronic elements.

According to another exemplary embodiment of the present invention the injection molding may encapsulate the whole film and the electronic elements.

According to an exemplary embodiment of the present invention the method may comprise additional surface finishing or coating before or after any of the sequences according to the said method.

In accordance with another aspect of the present invention an arrangement for carrying out said manufacturing method of an electromechanical structure, comprising one or more of entities:
  an entity for producing conductors and/or graphics on a surface,
  an entity for attaching electronic elements on a surface,
  an entity for forming a substantially flat film into a substantially three-dimensional shape,
  an entity for injection molding.

According to an exemplary embodiment of the invention, the arrangement comprises an entity for producing conductors and/or graphics on a surface, which entity may comprise inkjet printer, screen printer, and which entity may be a roll-to-roll or a reel-to-reel machine.

According to an exemplary embodiment of the invention, the arrangement comprises an entity for attaching electronic elements on a surface, which entity may comprise pick-and-place machine.

According to an exemplary embodiment of the invention, the arrangement comprises an entity for forming a substantially flat film into a substantially three-dimensional shape, which entity may comprise either continuously roll-fed or automatically in precut pieces fed, thermoforming machine or vacuum former machine.

According to an exemplary embodiment of the invention, the arrangement comprises an entity for injection molding, which entity may comprise hydraulic, mechanical, electric or hybrid injection molding machine.

According to another embodiment of the present invention the electromechanical structure achieved by the method and corresponding arrangement may be for example an electronic device incorporating a user interface (UI), such as a computer including desktop, laptop and palmtop devices. According to another embodiment of the present invention the electromechanical structure achieved by the method and corresponding arrangement may incorporate touchscreen or touch surface technology.

The previously presented considerations concerning the various embodiments of the electronic device may be flexibly applied to the embodiments of the method mutatis mutandis and vice versa, as being appreciated by a skilled person.

As briefly reviewed hereinbefore, the utility of the different aspects of the present invention arises from a plurality of issues depending on each particular embodiment. The manufacturing costs for producing the electromechanical structure in accordance with the present invention to provide a plurality of different functionalities may be kept low due to rather extensive use of affordable and easily obtainable materials, elements, and process technology.

The electromechanical structure obtained by the method and corresponding arrangement is scalable in the limitations of the entities according to the arrangement. The feasible process technology specifically provides for rapid and agile industrial scale manufacturing of the device in addition to mere prototyping scenarios.

The expression "a number of" may herein refer to any positive integer starting from one (1). The expression "a plurality of" may refer to any positive integer starting from two (2), respectively.

Different embodiments of the present invention are also disclosed in the attached dependent claims.

BRIEF DESCRIPTION OF THE DRAWINGS

Next, the embodiments of the present invention are more closely reviewed with reference to the attached drawings, wherein.

DETAILED DESCRIPTION OF THE EMBODIMENTS

Figure 1:
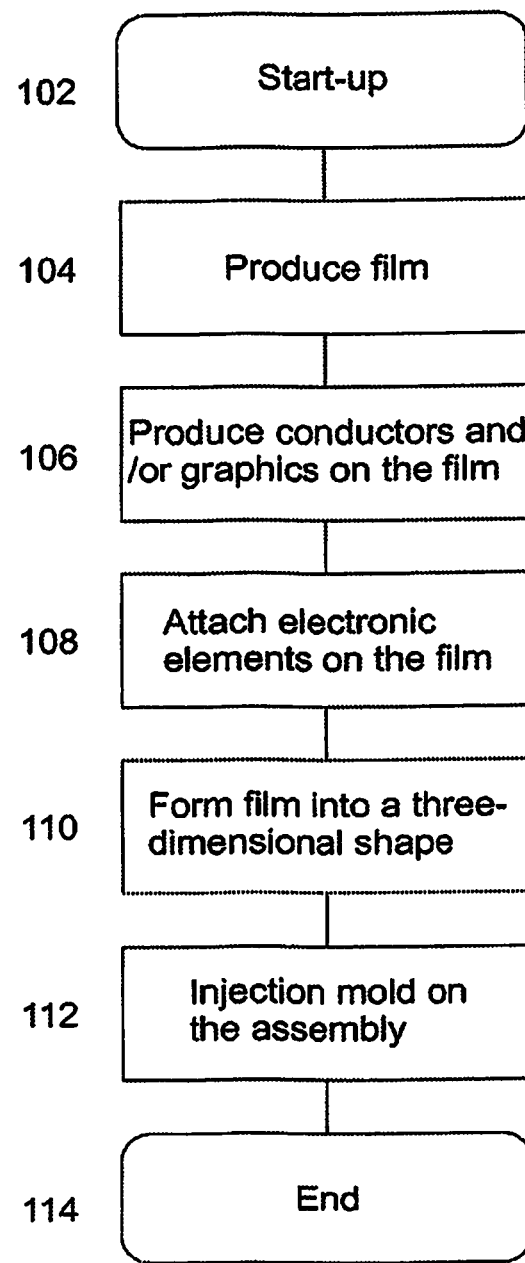
FIG. 1 is a flow diagram disclosing an embodiment of a method in accordance with the present invention.

With reference to FIG. 1, a flow diagram of one feasible embodiment for manufacturing the solution of the present invention.

At 102, referring to a start-up phase, the necessary tasks such as material, element and tools selection and acquisition take place. In determining the suitable elements and other components/electronics, specific care must be taken that the individual components and material selections work together and survive the selected manufacturing process of the overall arrangement, which is naturally preferably checked up-front on the basis of the manufacturing process vs. element data sheets, or by analyzing the produced prototypes, for example.

At 104, a substantially flat film is produced according to a preferred shape and size and then cleaned. Said film is preferably substantially thin sheet. The film comprises preferably polycarbonate (PC) or polyethylene terephthalate (PET) because these materials possess the most suitable thermoforming window (i.e. in which the material becomes substantially pliable for stretching and shaping) and flexibility required for efficient three-dimensional forming. The film material may optionally comprise other materials suitable according to the end product requirements and manufacturing requirements, such as for example flexibility, robustness, thermoforming window, strength, adhesion properties and other material properties in view of the electronics and the adjacent materials, or e.g. in view of available manufacturing techniques, are met. Said other materials may comprise other plastics, silicon, rubber, or a mixture of these. Further feasible materials comprise polymethyl methacrylate (PMMA), acrylonitrile-butadiene-styrene (ABS), Glycolized polyethylene terephthalate (PETG), high impact polystyrene (HIPS), high-density polyethylene (HDPE), acrylic polymer or a mixture of these. Thickness of the film may vary according to properties required from the film, such as material strength, flexibility, elasticity, transparency and/or size required from the final product. The film may contain a number of recesses, cavities, or holes for accommodating electronics such as electronic circuits, conductors, or component leads and/or sockets, etc.

The selected film may also be preconditioned prior to and/or during the illustrated processing phases. The film may be pre-conditioned to increase adhesion with other materials such as injection molded cover plastics, for example.

Optionally printed circuit board (PCB) or printed wiring board (PWB), with material, shape and size requirements according to the previously aforementioned film material requirements, may be chosen as the film.

At 106, conductors and/or graphics are produced on the film. The film may so comprise only conductors, only graphics or both conductors and graphics. Producing said conductors and/or graphics is preferably done by exploiting suitable printing technologies. E.g. an inkjet printer or other applicable device may be used to print said conductors and/or graphics on the film Preferably one device is used for producing both conductors and graphics. Optionally different devices for producing conductors and producing graphics may also be used.

Generally, feasible techniques for printing conductors and graphics may include screen printing, rotary screen printing, gravure printing, flexography, ink jet printing, tampo printing, etching (like with PWB-substrates, printed wiring board), transferlaminating, thin-film deposition, etc. For instance, in the context of conductive pastes, silver-based PTF (Polymer Thick Film) paste could be utilized for screen printing the desired circuit design on the film. Also e.g. copper or carbon-based PTF pastes may be used. Alternatively, copper/aluminum layers may be obtained by etching. In a further alternative, conductive LTCC (low temperature co-fired ceramic) or HTCC (high temperature co-fired ceramic) pastes may be sintered onto the film One shall take into account the properties of the film when selecting the material for conductors. For example, sintering temperature of LTCC pastes may be about 850 to 900° C., which may require using ceramic films. Further, silver/gold-based nanoparticle inks may be used for producing the conductors.

The paste/ink shall be preferably selected in connection with the printing technique and the film material because different printing techniques require different rheological properties from the used ink/paste, for instance. Further, different printing technologies provide varying amounts of ink/paste per time unit, which often affects the achievable conductivity figures.

Alternatively, the conductors and/or graphics may be provided within the film.

At 108, electronic components are attached on the film Said electronic components are preferably surface-mount technology (SMTs), through-hole, flip-chip or printed entities. Optionally, the elements may be produced by exploiting suitable printing procedures as depicted in the phase 106. Printed elements may be optionally produced on the substantially flat film by printing on said film Printed elements may be optionally produced separate from the substantially flat film by printing on a substrate, after which, the whole substrate or preferred pieces of the substrate comprising elements, may be attached on the substantially flat film.

SMT, though-hole, flip-chip and printed entities may be attached using optionally substantially flexible means by anchoring, gluing or by other adhesive, such as an epoxy adhesive. Both conductive (for enabling electrical contact) and non-conductive (for mere fixing) adhesives may be utilized. Said components may be selected by their technology and functions as well as so as to withstand the pressure and temperature of the utilized three-dimensional forming, such as the thermoforming or vacuum forming process, as well as the housing component-establishing process, such as injection molding process.

As an example, said elements may be electronic, electro-optic, electroacoustic, piezoelectric, electric, and/or electromechanical by nature, or at least comprise such components. Further on such elements and/or components may comprise control circuits, touch sensing such as strain, resistive, capacitive, (F)TIR and optical sensing components, tactile components and/or vibration components such as piezoelectric actuators or vibration motors, light-emitting components such as (O)LEDs, sound-emitting and or sound-receiving such as microphones and speakers, device operating parts such as memory chips, programmable logic chips and CPU (central processing unit), other processing devices such as digital signal processors (DSP), ALS devices, PS devices, processing devices (microprocessor, microcontroller, digital signal processor (DSP)), MEMS and/or various still unmentioned sensors. Indeed, a myriad of technologies may be implemented and structure may comprise various additional components, in addition to the disclosed ones. As being appreciated by skilled readers, also the configuration of the disclosed components may differ from the explicitly depicted one depending on the requirements of each intended use scenario wherein the present invention may be capitalized.

Optionally, the elements may be attached and configured in a predetermined, systematic, e.g. symmetric or matrix, formation.

Alternatively, the electronic elements may be provided within the film.

At 110, the film is formed from substantially flat into substantially three-dimensional. The said forming may be preferably done by thermoforming, using vacuum forming or pressure forming. Alternatively, said forming may be done by billow forming, drape forming, blow molding, pre or rotational molding.

Thermoforming as a process comprises heating the film into the thermoforming window (i.e. in which the material becomes substantially pliable for stretching and shaping), placing the film into a mold, applying vacuum in order to press the film against the mold so that the film mold to the shape of the mold, letting the film cool down while at the same time applying the vacuum and ejecting the cooled down film, which has now adapted the desired shape according to the mold, by releasing the vacuum and/or applying "air-eject" for easier removal of the film Additionally optionally, a cutting of the film e g to a preferred size or for better finish may be carried out before or after the thermoforming. The heating of the film into the thermoforming window may be optionally done inside the thermoforming machine e.g. in the mold or outside the thermoforming machine e.g. in an oven.

Considering the parameters and set-up of the preferred thermoforming process using vacuum or pressure, few further guidelines can be given as mere examples as being understood by the skilled persons. Few examples for the lower limit of the thermoforming temperature include: PC 150° C., PET 70° C., ABS 88° C.-120° C. The pressure applied on the film obtained either by pressing mechanically air into the mold or by sucking a vacuum into the mold should be roughly over some 100 psi for a single layer film construction whereas it should be roughly over some 200 psi for laminated structures. The used three-dimensional film and the process parameters shall be preferably selected such that said film does not melt. The film shall be positioned in the mold such that it remains properly fixed however so that the fixed points doesn't hinder the forming.

At 112, the assembly comprising the preferred elements attached to the now three-dimensional film is placed as an insert into a mold frame and injection molded.

The injection molding material molded over the three-dimensional film is optionally transparent and may comprise polymers such as polycarbonate (PC), polyethylene terephthalate (PET), polymethyl methacrylate (PMMA), polyamide (PA), cyclo olefin copolymer (COC), cyclo olefin polymer (COP), polytetrafluoroethylene (PTFE), polyvinyl chloride (PVC) or a mixture of these. Alternatively or additionally, the material may include glass. An applicable layer material shall be generally selected such that the desired flexibility, robustness, and other requirements like adhesion properties in view of the electronics and the adjacent materials, or e.g. in view of available manufacturing techniques, are met.

Considering the process parameters and set-up, few further guidelines can be given as mere examples as being understood by the skilled persons. When the three-dimensional film is PET and the plastics to be, for example, injection molded thereon is PC, the temperature of the melted PC may be about 280 to 320° C. and mold temperature about 20 to 95° C., e.g. about 80° C. The used three-dimensional film and the process parameters shall be preferably selected such that said film does not melt and remains substantially solid during the process. The film shall be positioned in the mold such that it remains properly fixed. Likewise, the preinstalled components, graphics and/or electronics shall be attached to the substrate such that they remain static during the molding.

The injection phase of the injection mold process comprises heating a material, chosen accordingly to the desired features, until molten, and then force injecting said material into the mold, wherein it sets on the insert. Preferably the injection molded material may be molded substantially exclusively partially over the film surfaces, which may comprise either molding on a surface portion of the film housing the preinstalled components, graphics and/or electronics or molding on a surface portion of the film not housing the preinstalled components, graphics and/or electronics. Optionally, the injection molded material may be molded substantially on the said film such that it encapsulates the whole film, which may comprise either that the molding encapsulates only partially the preinstalled components, graphics and/or electronics or that the molding encapsulates preinstalled components, graphics and/or electronics so that the preinstalled components, graphics and/or electronics are fully embedded inside the mold.

Generally in the embodiments of the present invention, the thickness of the established housing as well as the installation depth of said elements and electronics in the housing may be varied according to the application so that they may form a part of the surface (inner or outer surface of the overall electronic device) thereof or be completely embedded, or 'hidden', inside the housing. This enables customization of the toughness, elasticity, transparency, etc., of the constructed electromechanical structure as a whole as well as customization of the maintenance capabilities and protection of said embedded elements. Embedding the elements completely inside the housing typically provides better protection. Optionally leaving the elements to the surface provides less protection but enables easier maintenance or replacement of said elements. Depending on the application certain elements may be embedded entirely, when other elements are only partially embedded.

After the injection process the injected material is kept under a pressure and let to cool down, after which it may be taken out.

At 114, the method execution is ended. Further actions such as element regulation, quality control, surface treatment and/or finishing or furbishing may take place.

The use of advantageously flexible materials enables at least some of the method items to be carried out by roll-to-roll methods, which may provide additional benefits time-, cost- and even space-wise considering e.g. transportation and storage. In roll-to-roll or 'reel-to-reel' methods the desired entities, such as conductors, graphics and/or electronic elements, may be deposited on a continuous 'roll' substrate, which may be both long and wide, advancing either in constant or dynamic speed from a source roll, or a plurality of source rolls, to a destination roll during the procedure. The film may thus comprise multiple products that are to be cut separate later.

Roll-to-roll or 'reel-to-reel' methods may thus be used to combine at least two of the method steps 102, 104, 106, 108. All of the method steps 102, 104, 106, 108, i.e. substantially all of the method steps may be carried out by roll-to-roll or 'reel-to-reel' methods. Optionally all of the method steps (102-114), i.e. the whole as a whole, may be carried out by roll-to-roll or 'reel-to-reel' methods.

The roll-to-roll manufacturing advantageously enables rapid and cost effective manufacturing of products also in accordance with the present invention. During the roll-to-roll process several material layers may be joined together 'on the fly', and the aforesaid conductors, graphics and/or electronic elements may be structured on them prior to, upon, or after the actual joining instant. The source layers and the resulting band-like aggregate entity may be further subjected to various treatments during the process. Layer thicknesses and optionally also other properties should be selected so as to enable roll-to-roll processing to a preferred extent.

Figure 2:
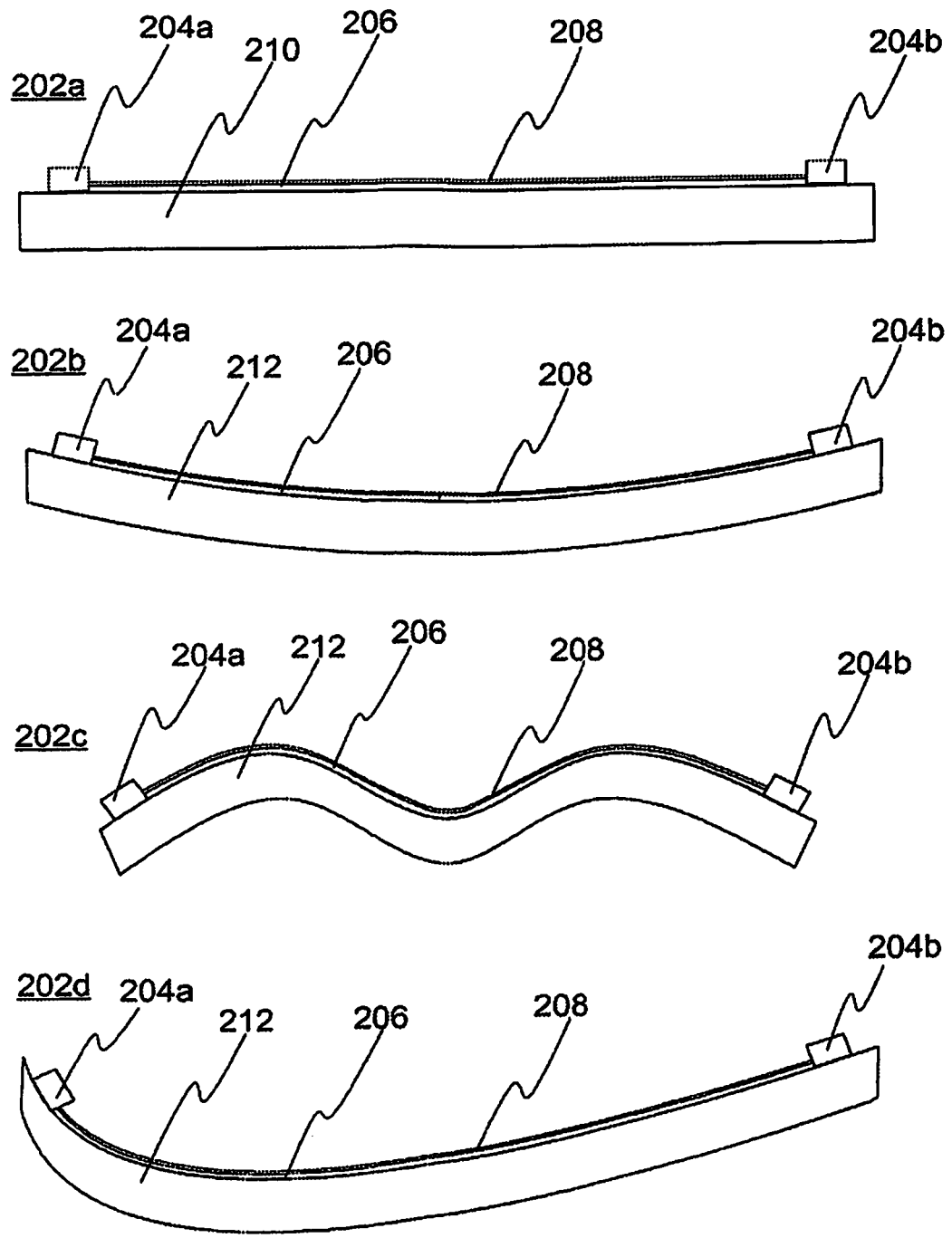
FIG. 2 illustrates the concept of forming film housing electronic elements three-dimensionally according to the present invention via exemplary embodiments.

FIG. 2 illustrates four different exemplary side views 202a, 202b, 202c, 202d of the film with the electronic elements attached thereon.

View 202a illustrates the substantially flat film 210 housing the attached electronic elements 204a & 204b and the conductors 206 and the graphics 208 thereon before forming said film from substantially flat into three-dimensional.

View 202b illustrates an example of a three-dimensional film 212, i.e. the film that was substantially flat before the forming process, housing the attached electronic elements 204a & 204b and the conductors 206 and the graphics 208 thereon. In this embodiment the film has been formed into a simple arch shape.

View 202c illustrates an example of a three-dimensional film 212, i.e. the film that was substantially flat before the forming process, housing the attached electronic elements 204a & 204b and the conductors 206 and the graphics 208 thereon. In this embodiment the film has been formed into an undulating shape.

View 202d illustrates an example of a three-dimensional film 212, i.e. the substantially flat film after the forming process, housing the attached electronic elements 204a & 204b and the conductors 206 and the graphics 208 thereon. In this embodiment the film has been molded into an asymmetric arch form.

The shape and size of the three-dimensionally formed film 212 is not restricted to any particular shape and may thus be manufactured to fit a wide range of applications.

Figure 3:
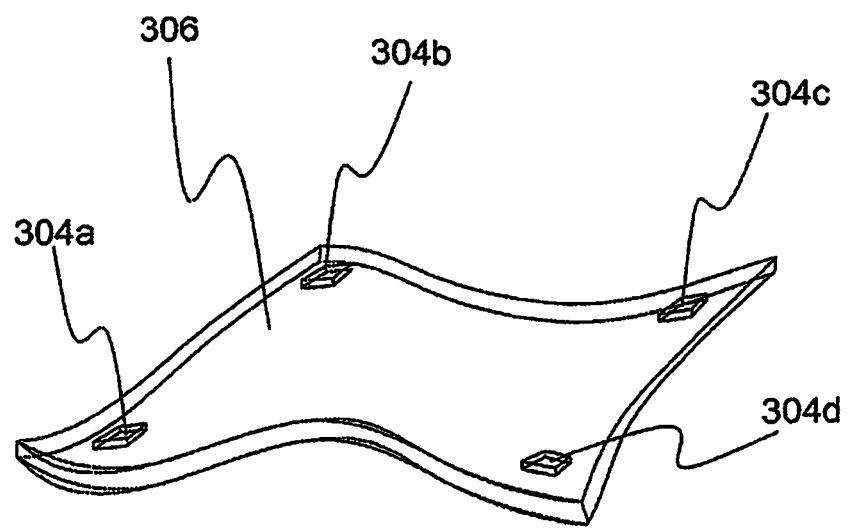
FIG. 3 is a block diagram of one embodiment of an arrangement comprising entities in accordance with the present invention.

FIG. 3 is an axonometric illustration of an exemplary embodiment of a three-dimensional shape achieved by the forming process. Said embodiment comprises a film 306 housing the attached electronic elements 304a, 304b, 304c & 304d and the conductors and the graphics thereon (not explicitly depicted). In this embodiment the film has been molded into asymmetric wave-like form.

The shape and size of the three-dimensionally formed film 306 is not restricted to any particular form and may thus be manufactured to fit a wide range of applications.

Figure 4:
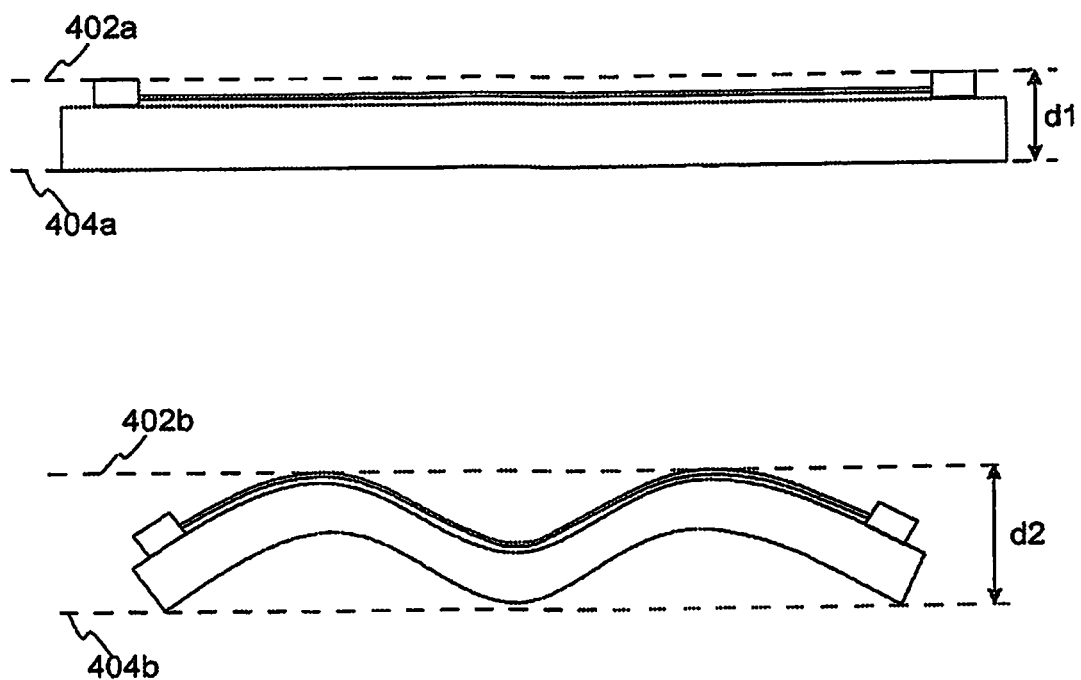
FIG. 4 illustrates an exemplary embodiment of the measurement used to describe the three-dimensional essence of a formed structure in accordance with the present invention.

FIG. 4 illustrates an exemplary embodiment of the measurement used to describe the three-dimensional essence of the formed structure. Three-dimensional form may be herein described as/through deviation, which is described herein. The substantially flat film can be seen as to fit between two parallel planar (flat) surfaces 402a & 404a, which take account even the slightest deformation on an even seemingly flat surface. After the three-dimensional forming process the shape, in which the previously flat film has been formed in, can be also seen as to fit between two parallel surfaces 402b & 404b. The distances d1 and d2, measured by the length of the line that extends maximally in between the two surfaces and in parallel with the normal of either surface against the other, yields the minimum distance that the surfaces can be situated from each other without overlapping with film, both as substantially flat and as three-dimensional. Said minimum distance between the two parallel surfaces in both cases may be compared as to count the deviation ratio. The deviation referred herein is so the ratio of the shortest distance d2 between the two parallel surfaces 402b & 404b that don't overlap with the three-dimensionally formed film to the shortest distance d1 between the two parallel surfaces 402a & 404a that don't overlap with the substantially flat film before the three-dimensional forming Preferably, the deviation ratio d2/d1 is preferably at least in correspondence to the numeric values presented herein before.

Figure 5:
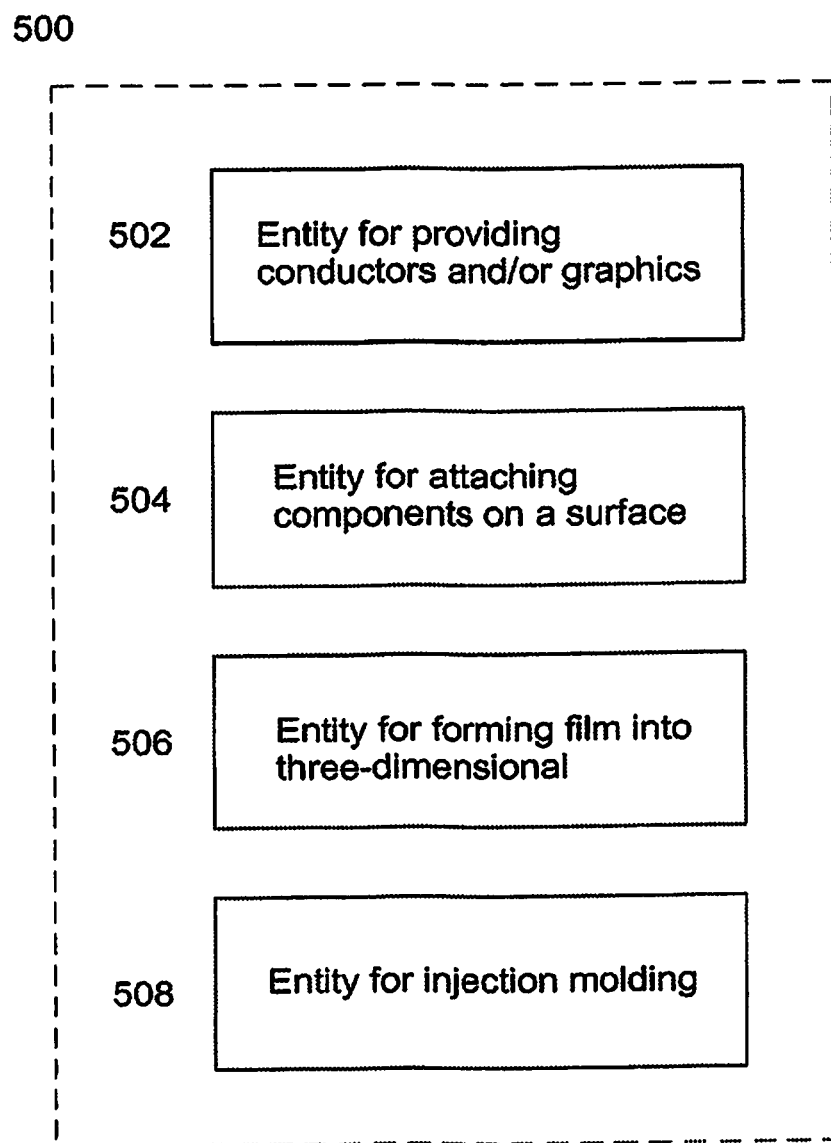
FIG. 5 illustrates a block diagram of one feasible embodiment for an arrangement for carrying out a manufacturing method of the present invention.

FIG. 5 illustrates a block diagram of one feasible embodiment for an arrangement 500 for carrying out the said manufacturing method of the present invention.

Block 502 represents an entity for producing conductors and/or graphics on a surface. Such entity may comprise a machine from at least one of the following: inkjet printer, screen printer, which may be roll-to-roll or reel-to-reel machines.

Block 504 represents an entity for attaching electronic elements on a surface. Such entity may comprise a pick-and-place machine. Pick-and-place machines are widely known and especially suitable herein because they allow fast and precise attaching of various different components and are highly flexible through programming.

Block 506 represents an entity for forming a substantially flat film into a substantially three-dimensional shape. Such entity may comprise either continuously roll-fed or automatically in-precut-pieces-fed, optionally computer numerical control (CNC) machine, thermoforming machine, vacuum former machine, pressure forming machine or blow molding machine or a combination of these.

Block 508 represents an entity for injection molding. Such an entity may comprise hydraulic, mechanical, electric or hybrid injection molding machine or a combination of these.

The scope of the invention is determined by the attached claims together with the equivalents thereof. The skilled persons will again appreciate the fact that the disclosed embodiments were constructed for illustrative purposes only, and the innovative fulcrum reviewed herein will cover further embodiments, embodiment combinations, variations and equivalents that better suit each particular use case of the invention.

What is claimed:

1. A system for manufacturing an electromechanical structure, the system comprising:
    a first entity configured to produce conductors or graphics on a film having a planar shape;
    a second entity including a pick-and-place machine configured to attach electronic elements on the film, the electronic elements including surface mount technology components;
    a third entity configured to form the film from the planar shape into a three-dimensional shape while the electronic elements are supported on the film, the third entity including an automatically in-precut-pieces-fed machine, a computer numerical control machine, a vacuum former machine, or a blow molding machine; and
    a fourth entity configured to mold a material on the film by injection molding, the fourth entity including a hydraulic, mechanical, electric, or hybrid injection molding machine arranged with the first, second, and third entities to manufacture the electromechanical structure,
    wherein the system is configured to select locations of the film for the pick-and-place machine to attach the electronic elements, wherein the selected locations are disposed outside of predetermined areas of maximum deformation introduced into the film during forming of the film into the three-dimensional shape.

2. The system of claim 1, wherein the first entity includes an inkjet printer, a screen printer, a roll-to-roll machine, or a reel-to-reel machine.

3. The system of claim 2, wherein the first entity is an inkjet printer.

4. The system of claim 2, wherein the first entity is a screen printer.

5. The system of claim 2, wherein the first entity is a roll-to-roll machine.

6. The system of claim 2, wherein the first entity is a reel-to-reel machine.

7. The system of claim 1, wherein the fourth entity is a hydraulic machine arranged with the first, second, and third entities to manufacture the electromechanical structure.

8. The system of claim 1, wherein the fourth entity is a hybrid injection molding machine.

9. The system of claim 1, wherein the third entity is an automatically in-precut-pieces-fed machine.

10. The system of claim 1, wherein the third entity is a computer numerical control machine.

11. The system of claim 1, wherein the third entity is a vacuum former machine.

12. The system of claim 1, wherein the third entity is a blow molding machine.

13. The system of claim 1, wherein the electronic elements further include at least one of through-hole components, flip-chip components, or printed components.

14. The system of claim 1, wherein the selected locations of the film for attachment of the electronic elements have a curvature after the film is formed into the three-dimensional shape.

15. A system for manufacturing an electromechanical structure, the system comprising:
    a first entity configured to produce conductors or graphics on a film having a planar shape;
    a second entity including a pick-and-place machine configured to attach electronic elements on the film, the electronic elements including surface mount technology components;
    a third entity configured to form the film from the planar shape into a three-dimensional shape when the electronic elements are supported on the film, the third entity including an automatically in-precut-pieces-fed machine, a computer numerical control machine, a vacuum former machine, or a blow molding machine; and
    a fourth entity configured to mold a material on the film by injection molding, the fourth entity including a hydraulic, mechanical, electric, or hybrid injection molding machine arranged with the first, second, and third entities to manufacture the electromechanical structure,
    wherein the system is configured to select locations of the film for the pick-and-place machine to attach the electronic elements, wherein the selected locations deform less than predetermined areas of maximum deformation introduced into the film during forming of the film from the planar shape into the three-dimensional shape,
    wherein the first, second, and third entities are arranged relative to one another to manufacture the electromechanical structure.

16. The system of claim 15, wherein the selected locations of the film for attachment of the electronic elements have a curvature after the film is formed into the three-dimensional shape.

17. The system of claim 15, wherein the first entity includes an inkjet printer, a screen printer, a roll-to-roll machine, or a reel-to-reel machine.

18. The system of claim 15, wherein the fourth entity is a hydraulic machine arranged with the first, second, and third entities to manufacture the electromechanical structure.

19. The system of claim 15, wherein the third entity is an automatically in-precut-pieces-fed machine.

20. The system of claim 15, wherein the second entity is positioned adjacent the first entity, the third entity is positioned adjacent the second entity, and the fourth entity is positioned adjacent the third entity such that the second entity is positioned between the first and third entities, and the third entity is positioned between the second and fourth entities.

* * * * *